United States Patent
Chlipala et al.

(10) Patent No.: US 8,350,589 B2
(45) Date of Patent: Jan. 8, 2013

(54) CRITICAL-PATH CIRCUIT FOR PERFORMANCE MONITORING

(75) Inventors: James D. Chlipala, Emmaus, PA (US); Richard P. Martin, Macungie, PA (US); Richard Muscavage, Gilbertsville, PA (US); Scott A. Segan, Allentown, PA (US)

(73) Assignee: Agere Systems LLC, Wilmington, DE (US)

( * ) Notice: Subject to any disclaimer, the term of this patent is extended or adjusted under 35 U.S.C. 154(b) by 0 days.

(21) Appl. No.: 12/738,931

(22) PCT Filed: Jan. 27, 2009

(86) PCT No.: PCT/US2009/032106
§ 371 (c)(1),
(2), (4) Date: Apr. 20, 2010

(87) PCT Pub. No.: WO2010/087817
PCT Pub. Date: Aug. 5, 2010

(65) Prior Publication Data
US 2011/0267096 A1   Nov. 3, 2011

(51) Int. Cl.
*H03K 19/00* (2006.01)
*G01R 31/28* (2006.01)
(52) U.S. Cl. .......................................... 326/16; 714/724
(58) Field of Classification Search .................. 326/16, 326/93, 95; 714/724, 726, 727, 729
See application file for complete search history.

(56) References Cited

U.S. PATENT DOCUMENTS

| | | | |
|---|---|---|---|
| 4,775,840 A * | 10/1988 | Ohmori et al. | 327/34 |
| 4,922,141 A | 5/1990 | Lofgren et al. | |
| 5,159,279 A * | 10/1992 | Shenoi et al. | 327/2 |
| 5,498,983 A | 3/1996 | Schoellkopf | |
| 5,870,404 A | 2/1999 | Ferraiolo et al. | |
| 7,005,871 B1 | 2/2006 | Davies et al. | |
| 7,116,142 B2 | 10/2006 | Ferraiolo et al. | |
| 7,149,903 B1 | 12/2006 | Chan et al. | |
| 7,257,723 B2 | 8/2007 | Galles | |
| 7,355,387 B2 | 4/2008 | LaBerge | |
| 7,392,413 B2 | 6/2008 | Shikata | |
| 7,408,371 B2 | 8/2008 | Kim et al. | |
| 7,417,482 B2 | 8/2008 | Elgebaly et al. | |
| 7,437,634 B2 | 10/2008 | Jaber et al. | |

(Continued)

OTHER PUBLICATIONS

PCT International Search Report and The Written Opinion dated Mar. 11, 2009, for International Application No. PCT/US09/32106.
Mridul Agarwal et al., "Circuit Failure Prediction and Its Application to Transistor Aging," 25th IEEE VLSI Test Symmposium (VTS '07), 2007, 8 pages.

(Continued)

*Primary Examiner* — Shawki Ismail
*Assistant Examiner* — Dylan White
(74) *Attorney, Agent, or Firm* — Mendelsohn, Drucker and Associates, P.C.; David L. Cargille; Steve Mendelsohn

(57) ABSTRACT

An integrated circuit having a monitor circuit for monitoring timing in a critical path having a target timing margin is disclosed. The monitor circuit has two shift registers, one of which includes a delay element that applies a delay value to a received signal. The inputs to the two shift registers form a signal input node capable of receiving an input signal. The monitor circuit also has a logic gate having an output and at least two inputs, each input connected to a corresponding one of the outputs of the two shift registers. The output of the logic gate indicates whether the target timing margin is satisfied or not satisfied.

17 Claims, 7 Drawing Sheets

U.S. PATENT DOCUMENTS

| | | | | |
|---|---|---|---|---|
| 7,617,409 B2 * | 11/2009 | Gilday et al. | | 713/503 |
| 7,714,619 B2 * | 5/2010 | Yamada | | 327/18 |
| 7,827,454 B2 * | 11/2010 | Kurimoto | | 714/731 |
| 7,911,221 B2 * | 3/2011 | Yamaoka et al. | | 326/16 |
| 7,913,139 B2 * | 3/2011 | Kurimoto | | 714/731 |
| 2008/0307277 A1 * | 12/2008 | Tschanz et al. | | 714/726 |
| 2011/0006827 A1 * | 1/2011 | Shimura | | 327/306 |
| 2011/0029829 A1 * | 2/2011 | Kurimoto | | 714/731 |
| 2011/0133786 A1 * | 6/2011 | Yamaoka et al. | | 327/97 |

OTHER PUBLICATIONS

Subhasish Mitra, "Circuit Failure Prediction for Robust System Design in Scaled CMOS," International Reliability Physics Symposium [online], May 2008, retrieved from internet: <URL: http://www.gigascale.org/pubs/1293/>, 8 pages.

Neil Savage, "Intel and ARM are Exploring Self-Correction Schemes to Boost Processor Performance and Cut Power," IEEE Spectrum, Feb. 2008, pp. 1-2.

* cited by examiner

346

CRITICAL-PATH CIRCUIT FOR PERFORMANCE MONITORING

BACKGROUND OF THE INVENTION

1. Field of the Invention

The present invention relates to digital integrated circuits, and, in particular, to timing-error detection in digital circuits.

2. Description of the Related Art

In recent years, circuit designers have investigated various approaches for predicting failures in integrated circuits (ICs). One such approach is known as critical-path performance monitoring. In conventional critical-path performance monitoring, a circuit designer identifies one or more signal paths that are deemed to be critical for the proper operation of an integrated circuit (known as "critical paths" or "critical data paths"), usually a path having a maximum delay. For a given circuit element within the critical path, the designer further identifies a target timing margin, i.e., a period of time before which a data signal transition should arrive at the circuit element, relative to a clock signal transition. A timing-monitor circuit (or "aging sensor") is provided on the integrated circuit to monitor the timing of the signals in each critical path. As the integrated circuit ages over time, the actual timing of the signals in each critical path tends to degrade. When a timing-monitor circuit determines that the actual timing margin of a signal in a critical path is less than the target timing margin, one may anticipate that a circuit failure is likely to occur, and the integrated circuit may take steps to self-correct, e.g., by adjusting the clock frequency, the voltage supply, or even the body bias voltage of the transistors in the integrated circuit. See, e.g., Neil Savage, "Intel and ARM are Exploring Self-Correction Schemes to Boost Processor Performance and Cut Power," Spectrum Online, February 2008, http://www.spectrum.ieee.org/feb08/5975, and Mridul Agarwal et al., "Circuit Failure Prediction and its application to Transistor Aging," 25th IEEE VLSI Test Symposium, May 6-10, 2007, pp. 277-286, each of which is hereby incorporated by reference in its entirety.

FIG. 1 is a block diagram of an integrated circuit 100 that includes a critical path 102 and a timing-monitor circuit 110 described by Agarwal et al. Critical path 102 includes circuit elements 104, 106. Timing-monitor circuit 110 includes (i) a D-type flip-flop 118 inserted after circuit element 104 and before circuit element 106 in critical path 102, (ii) a delay element 114 having delay value $T_G$ equal to the target timing margin for this location along critical path 102 and connected to the output of the first circuit element 104, (iii) another D-type flip-flop 116 connected to the output of delay element 114, and (iv) an exclusive-OR (XOR) logic gate 122 connected to the outputs of flip-flops 118, 116.

Depending on the application, delay value $T_G$ will typically be in the range from several hundred picoseconds to several nanoseconds. Timing-monitor circuit 110 operates by delaying a copy of the signal 112 appearing at the output of circuit element 104 by delay value $T_G$, latching the delayed signal at flip-flop 116, and comparing the output from flip-flop 116 via XOR logic gate 122 to the output signal 120 appearing at the output of flip-flop 118. Output signal 126 from XOR logic gate 122 is then latched into a timing failure indicator register 124, which produces output signal 128. Output signal 128 is then passed to a controller, which may adjust either the clock rate or a supply voltage for the integrated circuit, based on output signal 128.

As a first example, assuming that signal 112 comprises a data transition from a logic value 0 to a logic value 1 and that the setup time for flip-flop 116 is just satisfied (i.e., has zero timing margin), then the logic value 1 will be successfully latched into flip-flop 116 with clock CL. Since the 0-to-1 transition will arrive at input D of flip-flop 118 at some earlier time with respect to clock CL, flip-flop 118 will also successfully latch in the logic value 1. The XOR timing failure indicator register 126 will have a logic value 0, because both flip-flops have the same output values. This logic value 0 indicates that flip-flop 118 in the critical path has satisfied its setup time by at least the target timing margin set by delay value $T_G$.

As a second example, where a 0-to-1 data transition in signal 112 occurs a short time later than in the above example (e.g., due to the aging of circuit elements in critical path 102 upstream of signal 112), flip-flop 118 may successfully latch in the logic value 1 with clock CL, while flip-flop 116 latches in the logic value 0 due to delay value $T_G$. XOR timing failure indicator register 126 will now have a logic value 1, indicating that a setup violation has occurred in flip-flop 116 and that flip-flop 118 has a setup margin of less than delay value $T_G$. As such, a timing failure will be more likely to occur, e.g., as the circuit continues to age.

Under certain circumstances, however, timing-monitor circuit 110 may give an erroneous indication that the timing for critical path 102 is satisfied, even though a setup violation may occur. In particular, if the 0-to-1 transition occurs later than in the second example above, flip-flops 116, 118 both may experience setup violations and incorrectly latch in a logic value 0. In this instance, the XOR timing failure indicator register 126 will incorrectly show a logic value 0, because it is unable to detect the case of setup violations in both flip-flops.

In addition to this susceptibility to give false negatives, timing-monitor circuit 110 has several other disadvantages. First, because only one delay element 114 is used, timing issues can be identified only with the resolution of delay value $T_G$ of that element.

Second, in order for timing-monitor circuit 110 to test the timing of critical path 102, some minimal amount of data activity must occur in critical path 102, in order to cause enough data transitions in signal 112 to produce timing failure (or success) indications. If there is little data activity in critical path 102, then delays in critical path 102 (e.g., due to aging) may arise but be undetected by timing-monitor circuit 110.

Third, timing-monitor circuits are typically added to an integrated circuit only after the physical design and static timing analysis (including the identification of critical paths) for the integrated circuit have been completed. When flip-flop 118 in timing-monitor circuit 110 is inserted into critical path 102, however, both the timing and loading of critical path 102 are impacted. As such, circuit loading and timing analysis likely need to be repeated after timing-monitor circuit 110 is placed, and the physical design may have to be changed to accommodate the timing-monitor circuit 110. Such changes may have a significant impact on the design schedule for the integrated circuit.

SUMMARY OF THE INVENTION

Problems in the prior art are addressed in accordance with the principles of the present invention by an improved timing-monitor circuit placed in a region near a critical path to be monitored in an integrated circuit.

Thus, in one embodiment, the present invention is an integrated circuit having a monitor circuit for monitoring timing in a critical path in the integrated circuit. The critical path has a target timing margin. The monitor circuit includes a first shift register having an input and an output and having a delay circuit that applies a delay value to a received signal. The monitor circuit further includes a second shift register having an input and an output, wherein the inputs of the first and second shift registers are connected together to form a signal input node capable of receiving an input signal. The monitor circuit also includes a logic circuit having an output and at least two inputs, each input connected to a corresponding one of the outputs of the first and second shift registers. The output of the logic circuit indicates whether the target timing margin is satisfied or not satisfied.

In another embodiment, the present invention is an apparatus for monitoring timing in a critical path in an integrated circuit. The critical path has a target timing margin. The apparatus comprises: (a) means for splitting an input signal into a first path including a first shift register and a second path including a second shift register; (b) means for delaying the input signal in the first path by a first delay; (c) means for comparing the input signal in the second path with the delayed input signal in the first path; and (d) means for producing, based on the comparison, an output indicating whether the target timing margin is satisfied or not satisfied.

In still another embodiment, the present invention is a method for monitoring timing in a critical path in an integrated circuit. The critical path has a target timing margin. An input signal is split into a first path including a first shift register and a second path including a second shift register. The input signal in the first path is delayed by a first delay. The input signal in the second path is compared with the delayed input signal in the first path. Finally, based on the comparison, an output is produced, indicating whether the target timing margin is satisfied or not satisfied.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
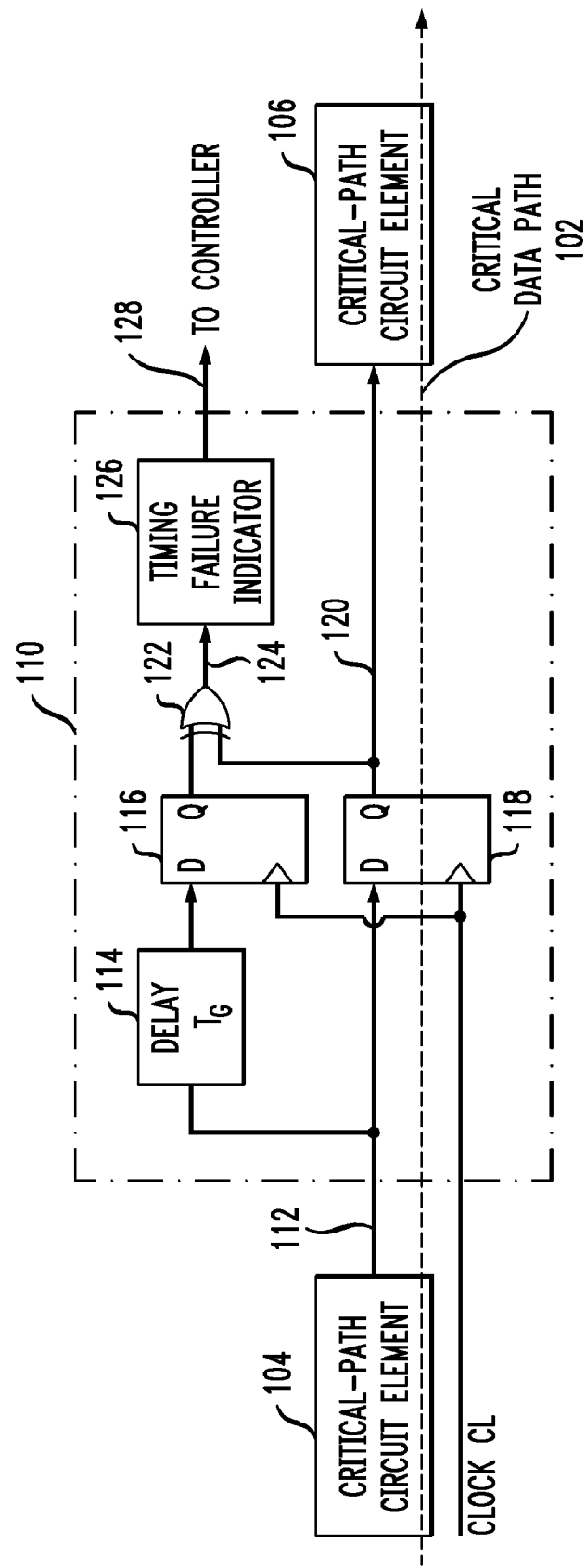
FIG. 1 is a schematic block diagram of a prior-art timing-monitor circuit.
Figure 2:
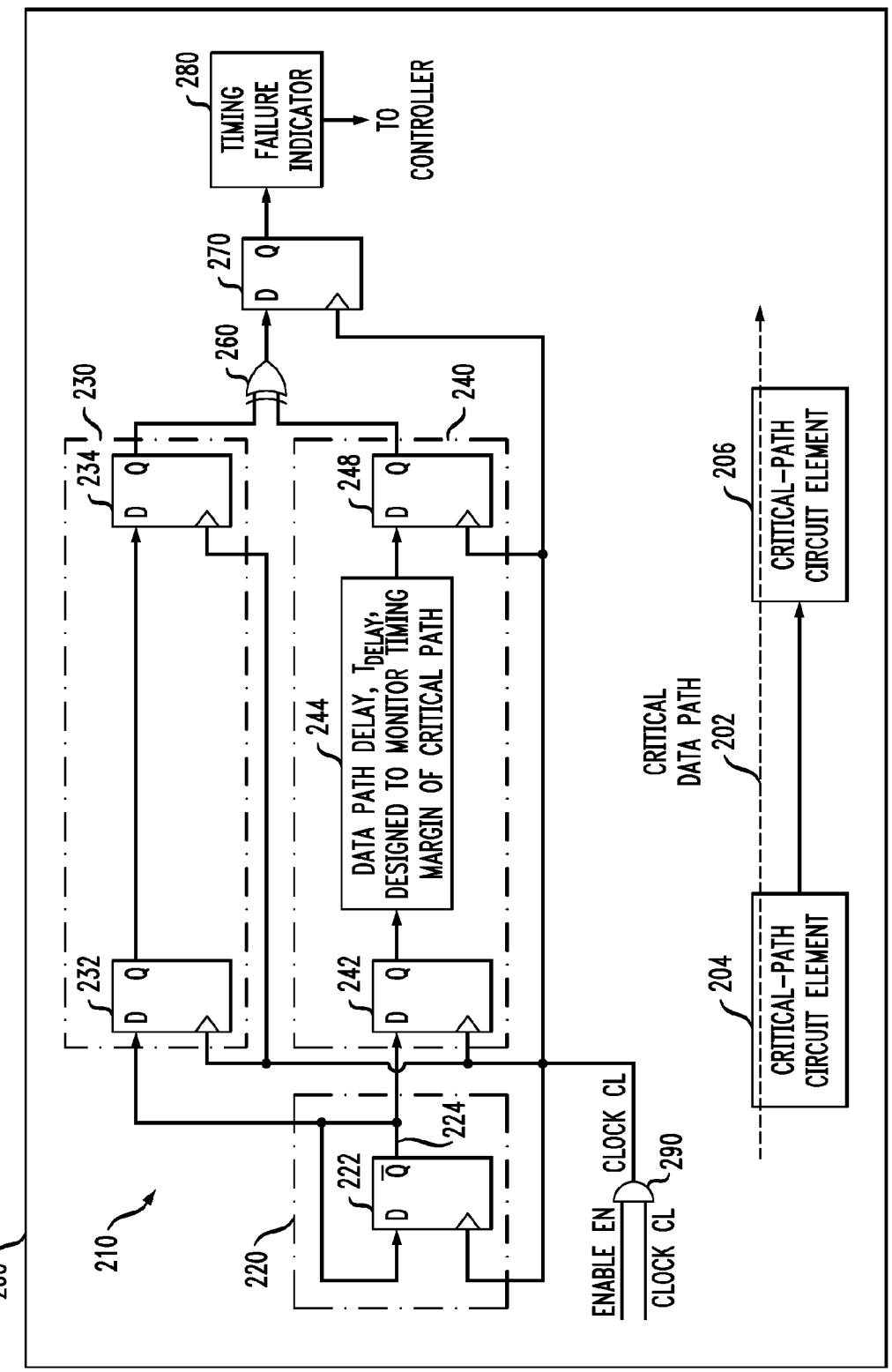
FIG. 2 is a schematic block diagram of a timing-monitor circuit in accordance with an embodiment of the invention.

FIG. 2 depicts an integrated circuit 200 including a timing-monitor circuit 210 in accordance with one embodiment of the invention. Timing-monitor circuit 210 is preferably placed sufficiently near a critical path 202 having circuit elements 204 and 206 so that timing-monitor circuit 210 experiences the same process, voltage, temperature, and aging effects as the circuit elements in critical path 202. In contrast with timing-monitor circuit 110 discussed above with respect to FIG. 1, which is located within and connected to critical path 102, timing monitor circuit 210 is preferably substantially independent of critical path 202 (i.e., having no components in common with critical path 202 and relying on no signal traversing critical path 202 except clock CL, which may be shared by timing monitor circuit 210 and critical path 202).

Timing-monitor circuit 210 includes (i) a first shift register 230 formed by D-type flip-flops 232 and 234 and (ii) a second shift register 240 formed by D-type flip-flops 242 and 248. Second shift register 240 further includes a delay element 244, which provides a delay value $T_{DELAY}$. The design value of delay value $T_{DELAY}$ is preferably equal to a predetermined period of time that is a function of a target timing margin for circuit element 206 in critical path 202. For example, the predetermined period of time may be about one clock period minus the target timing margin. Over time, however, the actual delay value $T_{DELAY}$ may increase, e.g., due to aging effects.

The outputs of shift registers 230 and 240 are connected to the inputs of XOR logic gate 260, and the output of XOR logic gate 260 is connected to flip-flop 270, which produces a timing failure indicator signal passed to timing failure indicator 280. Timing-monitor circuit 210 may further include an enable/disable circuit 290, which passes clock signal CL to the other elements in the circuit only if it receives an enable signal EN. Enable/disable circuit 290 may be implemented as an AND logic gate as shown in FIG. 2, or, alternatively, as a NAND, NOR, OR, or XOR logic gate (with an appropriate polarity of enable signal EN).

Timing-monitor circuit 210 may further include a pulse generator 220 to produce signal 224, which is used as a "test data" signal to be input to shift registers 230 and 240. In the embodiment shown in FIG. 2, pulse generator 220 is a flip-flop 222 configured as a divide-by-2 circuit (i.e., having its NOT-Q output connected to its D input) that is driven by clock CL, although other suitable pulse generators may be employed. In the embodiment shown in FIG. 2, for each two clock cycles, flip-flop 222 produces one output pulse at its NOT-Q output. The signal at the NOT-Q output of flip-flop 222 is then split and inputted to the D inputs of flip-flops 232 and 242. Alternatively, a Q output, rather than the NOT-Q output) of flip-flop 222 may be used to drive the D inputs of flip-flops 232 and 242.

For a given rising edge of clock CL, a data transition (e.g., 0-to-1) in signal 224 is latched into flip-flops 232 and 242. On the next rising edge of clock CL, the data transition will be latched into flip-flop 234 in the undelayed shift register 230. If the actual delay value $T_{DELAY}$ in delay element 244 does not exceed the predetermined period of time plus the target timing margin (e.g., the actual delay value $T_{DELAY}$ does not exceed about one clock period), then the setup time of flip-flop 248 will not be violated), and flip-flop 248 in the delayed shift register 240 will correctly latch in the same data transition. XOR logic gate 260 will accordingly produce a logic value 0 at its output, indicating that the timing in the test data path including flip-flop 242, delay element 244, and flip-flop 248 meets design limits. Because the test data path including flip-flop 242, delay element 244, and flip-flop 248 is placed sufficiently near critical path 202 so that the elements in the two paths experience the same process, voltage, temperature, and aging effects, the logic value 0 at the output of XOR logic gate 260 is assumed to indicate that the timing in critical path 202 also meets design limits.

On the other hand, if process, voltage, temperature, and/or aging effects have caused the actual delay value $T_{DELAY}$ to exceed the predetermined period of time plus the target timing margin (e.g., the actual delay value $T_{DELAY}$ exceeds about one clock period), then the target timing margin will no longer be satisfied. Flip-flop 234 in the undelayed shift register 230 will correctly latch in the data transition value (e.g., logic value 1), but flip-flop 248 in the delayed shift register 240 will latch in an incorrect data transition value (e.g., 0). In this case, XOR logic gate 260 will produce a logic value 1 at its output, suggesting that the timing in critical path 202 has not been satisfied. Flip-flop 270, in turn, will produce a timing failure indicator signal that is passed to timing failure indicator 280.

In practice, delay element 244 is preferably selected during the design process from among a predetermined set of standard delay circuits (including, e.g., circuit macros). The standard delay circuits may provide propagation delays corresponding to various fractions of a clock period, based on the specific target timing margins to be monitored, which may be set at the onset of a project. The standard delay circuits preferably contain standard cells with a mixture of high-, standard-, and low-threshold voltage values that closely parallel the critical paths of the integrated circuit to be monitored. Further, delay element 244 may be an adjustable delay element, such that timing monitor circuit 210 may accommodate a range of clock frequencies during operation of integrated circuit 200.

Timing-monitor circuit 210 has numerous advantages over prior-art timing-monitor circuit 110 of FIG. 1. First, timing-monitor circuit 210 may be inserted in the physical design well before final statistical timing analysis is performed. Multiple placements in various key locations on an integrated circuit may be made, without the addition of any extra loading to critical paths and with the additional loading on the clock signal of only one extra logic gate per instance of timing monitor circuit 210. As a result, timing-monitor circuit 210 has minimal impact on the static timing analysis or the final physical design of the integrated circuit.

Second, timing-monitor circuit 210 is not susceptible to the problem of false negatives discussed above with respect to timing-monitor circuit 110, because flip-flop 234 will always latch the correct data.

Third, timing-monitor circuit 210 does not rely on the integrated circuit to provide data transitions to test the monitored critical path. Rather, pulse generator 220 provides plentiful data transitions through timing-monitor circuit 210, such that the monitored critical path is frequently tested, albeit indirectly.

Fourth, because enable/disable circuit 290 receives the clock signal CL and distributes it to the remaining circuit elements in timing-monitor circuit 210, adding timing-monitor circuit 210 to an integrated circuit adds only a single gate to the integrated circuit clock loading.

Figure 3:
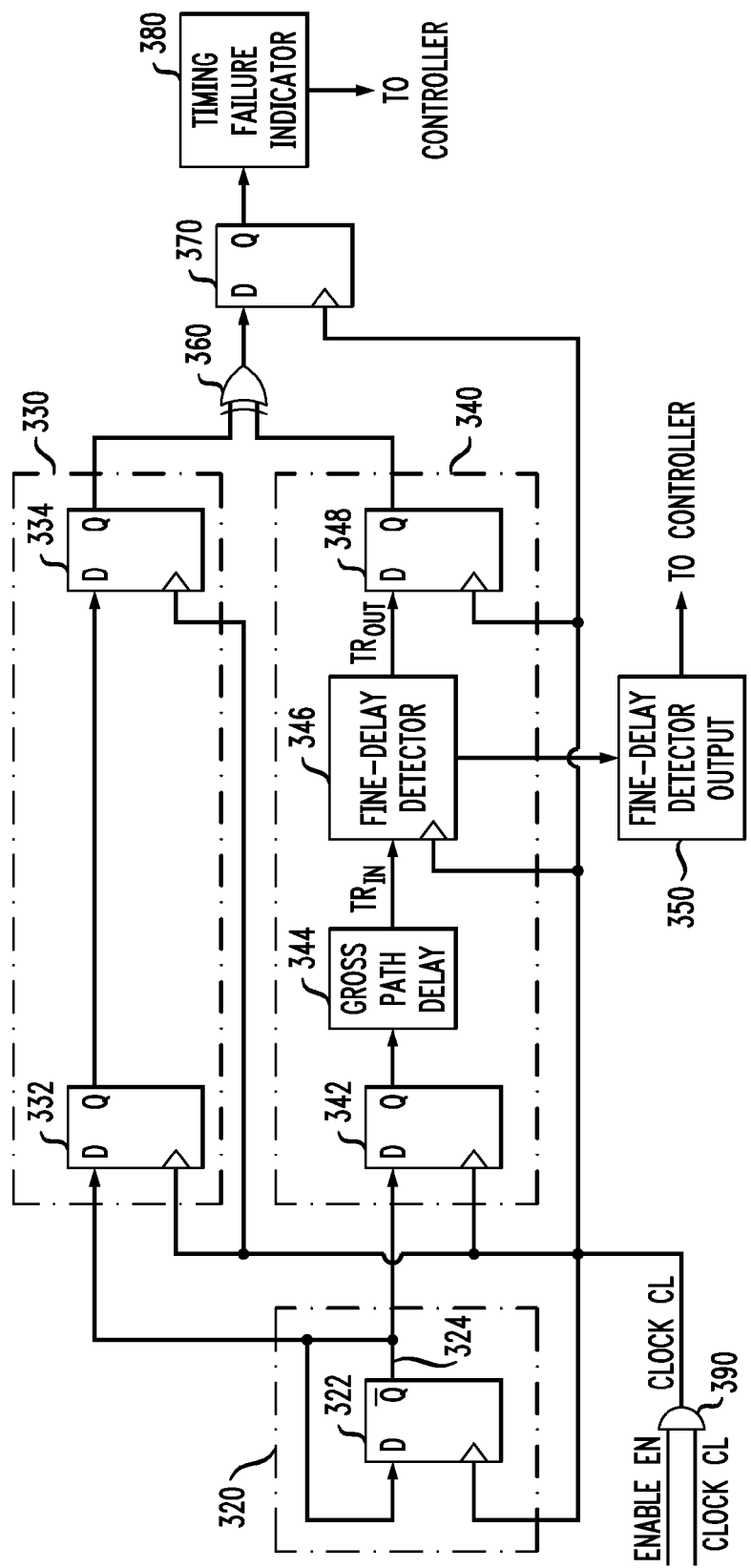
FIG. 3 is a schematic block diagram of a timing-monitor circuit including a fine-delay detector in accordance with another embodiment of the invention.

FIG. 3 depicts timing-monitor circuit 310 in accordance with another embodiment of the invention. Timing-monitor circuit 310 in FIG. 3 is similar to timing-monitor circuit 210 of FIG. 2 with similar elements identified using labels having the same last two digits, except that, in timing-monitor circuit 310, a gross-delay element 344 and a fine-delay detector circuit 346 connected to fine-delay output register 350 have been substituted in place of delay element 244 in FIG. 2.

The delay value of gross-delay element 344 is selected to be about the same as a substantial portion of the delay value provided by delay element 244, while the delay value associated with fine-delay detector 346 is selected to be the remaining portion of the delay value provided by delay element 244. As such, the total path delay value between flip-flops 242 and 248 in timing-monitor circuit 210 in FIG. 2 and between flip-flops 342 and 348 in timing-monitor circuit 310 in FIG. 3 is approximately the same. Fine-delay detector 346 is preferably adapted (i) to compare, with a predetermined resolution, the actual delay of gross-delay element 344 with the predetermined period of time (which is a function of the target timing margin, as discussed above), and (ii) to produce, based on the result, a detector output signal that corresponds to the actual timing margin in timing-monitor circuit 310. The detector output signal is then passed to fine-delay detector register 350. In a preferred embodiment, fine-delay detector 346 is adapted to detect not only increases in the amount of actual delay associated with gross-delay element 344 but also decreases in the amount of such delay. In so doing, fine-delay detector 346 is also capable of evaluating increases and decreases in the actual timing margin in timing-monitor circuit 310.

Figure 4:
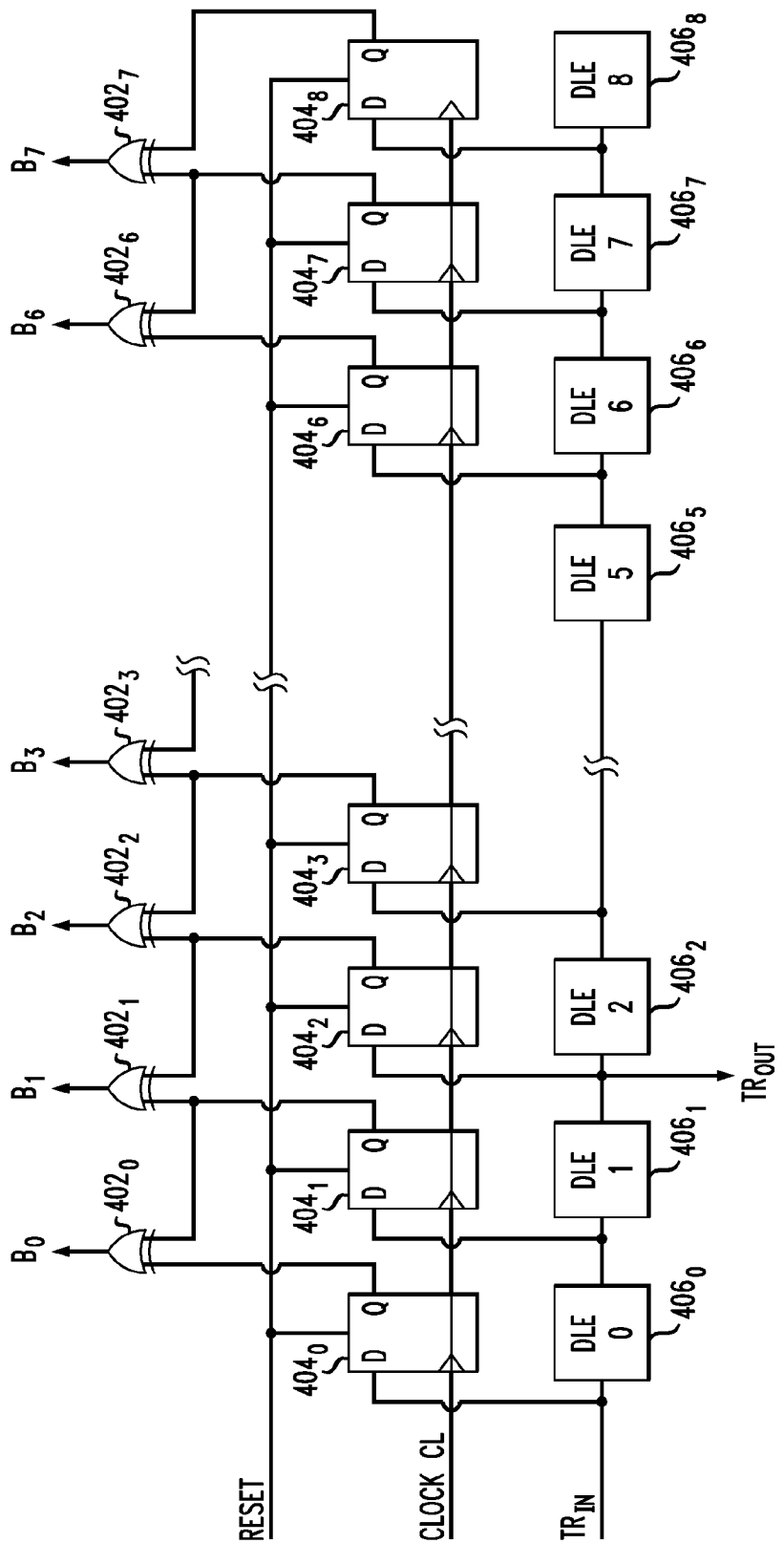
FIG. 4 is a detailed block diagram of an embodiment of the fine-delay detector of FIG. 3.

FIG. 4 depicts an exemplary embodiment of fine-delay detector circuit 346 of FIG. 3. As shown in FIG. 4, fine-delay detector circuit 346 includes nine delay-line elements (DLEs) $406_0$-$406_8$ connected in series, nine flip-flops $404_0$-$404_8$, and eight XOR logic gates $402_0$-$402_7$. The inputs to flip-flop $404_0$ and to DLE $406_0$ are connected to signal $TR_{IN}$, taken from the output of gross-delay element 344 in FIG. 3. The outputs from DLEs $406_0$-$406_7$ are connected respectively to the D inputs of flip-flops $404_1$-$404_8$ and to the inputs of DLEs $406_1$-$406_8$. DLE $406_8$ is provided so that the output loading of DLE $406_7$ is the same as that of DLEs $406_0$-$406_6$. As such, the output from DLE $406_8$ is not used.

In this configuration, input signal $TR_{IN}$ propagates down the delay line formed by DLEs $406_0$-$406_8$. DLEs $406_0$-$406_8$ and flip-flops $404_0$-$404_8$ form a "thermometer" register. In a thermometer register having a set of n output bits, the $0^{th}$ through $i^{th}$ output bits are all high, while the rest of the output bits (i.e., the $(i+1)^{th}$ through the $(n-1)^{th}$ output bits) are all low (or vice versa). The point of transition of the values of the thermometer register output bits (e.g., from logic value 1 to logic value 0) indicates how far input signal $TR_{IN}$ has propagated down the delay line formed by DLEs $406_0$-$406_8$ at the time when the clock signal CL arrives at flip-flops $404_0$-$404_8$.

The Q outputs from consecutive pairs of flip-flops $404_0$-$404_8$ are connected to the respective inputs of XOR logic gates $402_0$-$402_7$. XOR logic gates $402_0$-$402_7$, in turn, respectively produce output bits $B_0$-$B_7$, which provide a measure of the actual delay of gross-delay element 344. DLEs $406_0$-$406_8$, flip-flops $404_0$-$404_8$, and XOR logic gates $402_0$-$402_7$ thus form a "one-hot" register, in which only one output bit is high (i.e., "1"), while the rest are low (i.e., "0") (or vice versa). The location of the high output bit within output bits $B_0$-$B_7$ indicates how far the input signal $TR_{IN}$ has propagated down the delay line formed by DLEs $406_0$-$406_8$ at the time when the clock signal CL arrives at flip-flops $404_0$-$404_8$.

Output bits $B_0$-$B_7$ are then stored in fine-delay detector output register 350 for use, e.g., by an IC timing controller (not shown). The IC timing controller may then use the timing information provided by output bits $B_0$-$B_7$, e.g., to adjust the rate of the integrated circuit clock or the power supply voltage based on the timing information. For example, if the target timing margin has been met with excess margin, then the clock rate may be increased without fear of creating timing errors in critical path 202. On the other hand, if the target timing margin is not satisfied, the clock rate may be decreased, in order to improve the timing in critical path 202.

Output signal $TR_{OUT}$ of detector circuit 346 may be connected from any one of the outputs from DLE $406_0$-$406_8$ to the D input of flip-flop 348 of FIG. 3. The specific DLE output used as the connection for output signal $TR_{OUT}$ may be selected during the design of the integrated circuit, according to the extent to which the designer wishes to detect successful (i.e., earlier) or unsuccessful (i.e., later) timing, as further explained below. In the embodiment shown in FIG. 4, for example, output signal $TR_{OUT}$ is taken directly at the output of DLE $406_1$.

Alternatively, the outputs from DLE $406_0$-$406_8$ may be connected to a 9×1 selection switch (not shown), and the output from the selection switch may be taken as output signal $TR_{OUT}$. The selection switch may be an active-gate multiplexer, transmission gate (Tgate) multiplexer, tristatable buffer multiplexer, or other suitable selection switch or multiplexer. In this alternative embodiment, the selection switch may select any one of the outputs from DLE $406_0$-$406_8$ to use as output signal $TR_{OUT}$, based on a control signal, e.g., from a timing controller.

Figure 5:
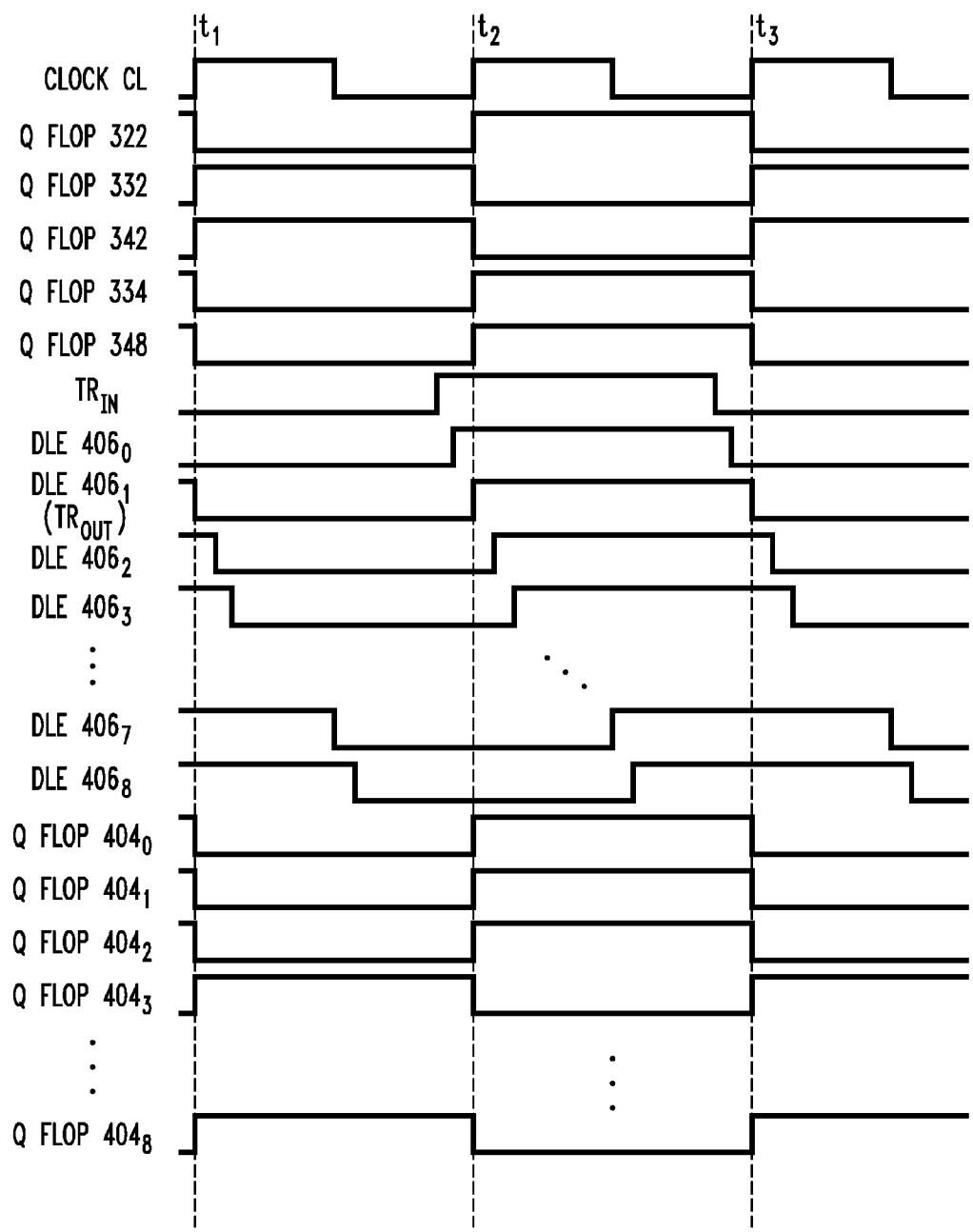
FIGS. 5-7 are timing diagrams illustrating the operation of the timing-monitor circuit shown in FIG. 3 with the fine-delay detector shown in FIG. 4.
Figure 6:
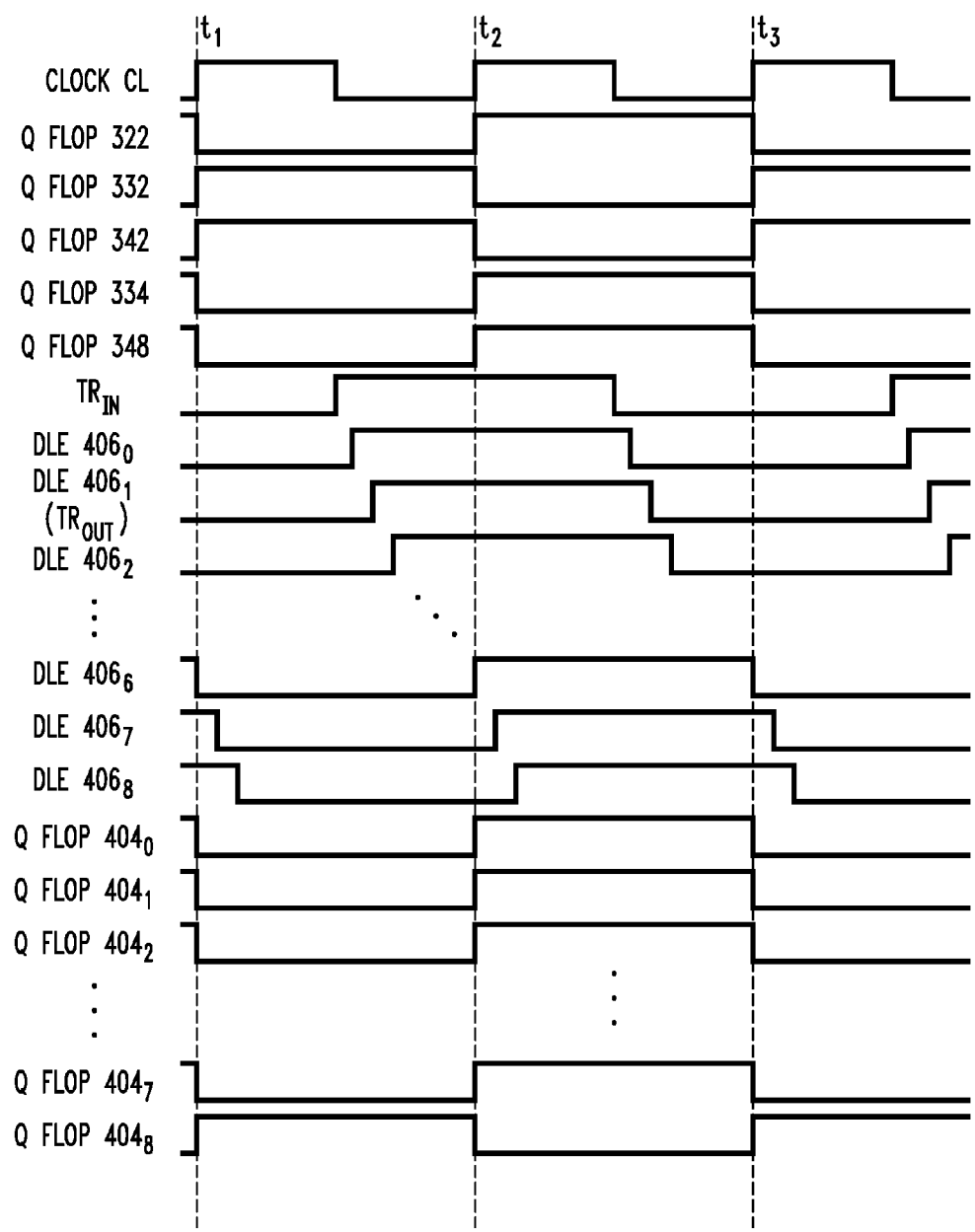
Figure 7:
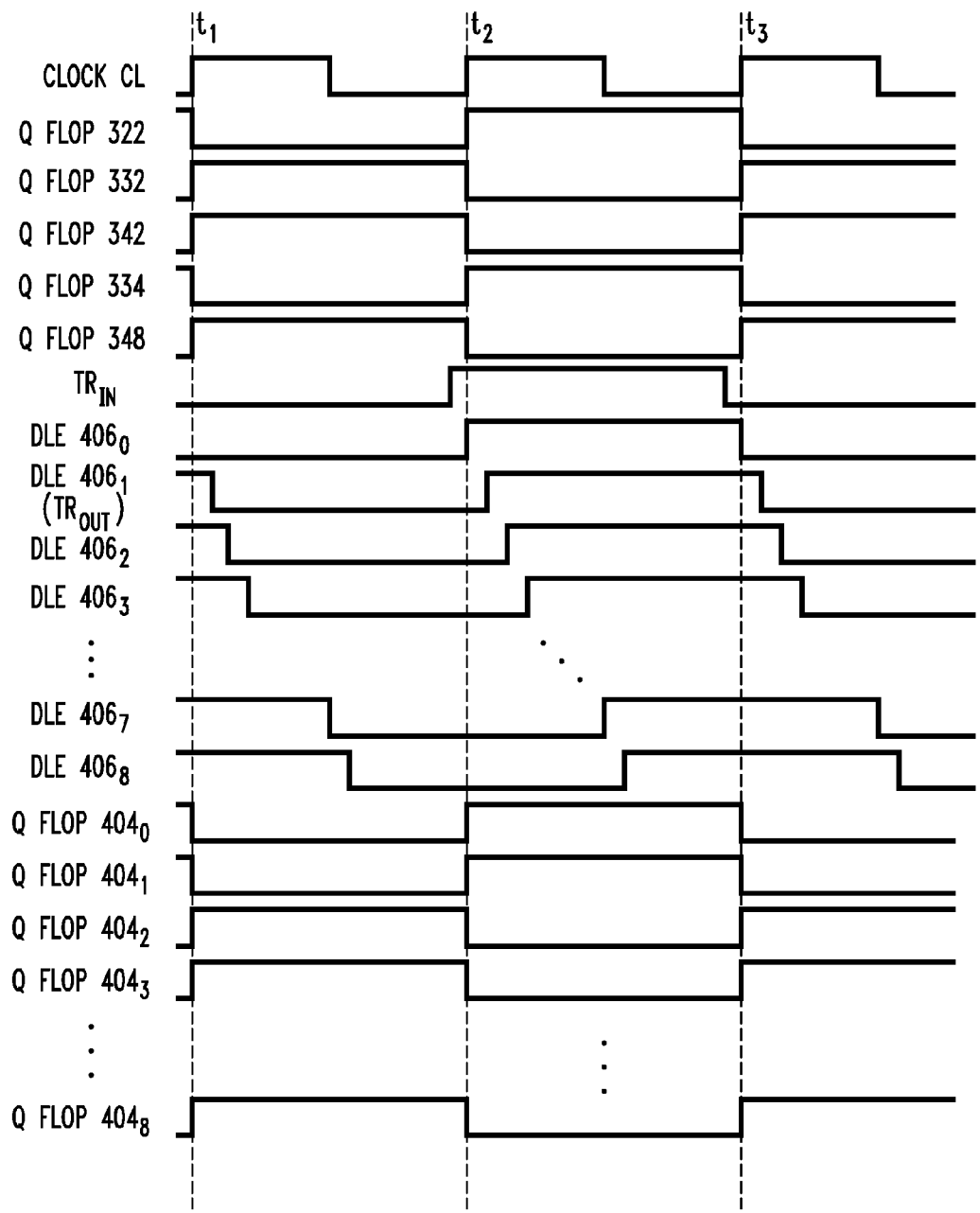

The operation of timing-monitor circuit 310 shown in FIG. 3 and fine-delay detector circuit 346 shown in FIG. 4 may be further understood with reference to the following three cases, illustrated respectively by the timing diagrams shown in FIGS. 5-7.

Case 1: Target Timing Margin Met With No Excess Margin

FIG. 5 illustrates the timing for Case 1, in which the target timing margin is met with no excess margin. In Case 1, the design value for the sum of the delays (i) from the clock CL to output Q of flip-flop 342, (ii) through gross-delay element 344, and (iii) through fine-delay detector 346 (e.g., the time for signal $TR_{IN}$ to travel to signal $TR_{OUT}$) is selected to be equal to about one clock period (i.e., the target timing margin is assumed to be minimal, such that little or no slack exists).

A data logic value 1 is latched into flip-flops 332 and 342 in FIG. 3 on the first rising edge of the clock CL, as shown at time $t_1$ in the timing diagram in FIG. 5. Accordingly, the Q outputs of flip-flops 332 and 342 transition from a logic value 0 to a logic value 1.

Just before the second rising edge of the clock CL at time $t_2$ in FIG. 5, by design, the 0-to-1 transition will be observed across the entire gross-delay element 344 and the outputs of the first two DLEs $406_0$ and $406_1$ in fine-delay detector 346. At the second rising edge of clock CL (at time $t_2$), a logic value 1 will be observed at the outputs of the first two DLEs nearest the $TR_{IN}$ input (i.e., DLEs $406_0$ and $406_1$). The outputs of the seven remaining DLEs $406_2$-$406_8$ will all show logic value 0. The second rising edge of clock CL will also register a logic value 1 into flip-flops 334 and 348 in FIG. 3, such that the timing failure indicator 380 will eventually register a logic value 0, indicating that timing constraints have been met.

The second rising edge of clock CL will also register a logic value 1 into flip-flops $404_0$-$404_2$ and logic value 0 into flip-flops $404_3$-$404_8$ in FIG. 4. Accordingly, the bit values B[0:7] outputted by XOR logic gates $402_0$-$402_7$ will respectively have logic values {0010 0000}. The $B_2$ bit value of logic value 1 indicates that the 0-to-1 transition occurs within the third DLE (DLE $406_2$) at the time of the second rising edge of clock CL. In other words, the input to DLE $406_2$ (as well as the output from DLE $406_1$) is logic value 1, and the output from DLE $406_2$ has a logic value 0 at the time of the second rising edge of clock CL (time $t_2$). In this instance, these XOR output bit values (B[0:7]={0010 0000}) indicate that the target timing margin was met with minimum detectable excess margin.

Case 2: Target Timing Margin Met With Significant Excess Margin

FIG. 6 illustrates the timing for Case 2, in which the target timing margin is met with significant excess margin. In Case 2, as in Case 1, the design value for the sum of the delays (i) from the clock CL to output Q of flip-flop 342, (ii) through gross-delay element 344, and (iii) through fine-delay detector 346 is selected to be equal to about one clock period (i.e., the target timing margin is assumed to be minimal, such that little or no slack exists). In Case 2, however, it is assumed that a combination of clock-distribution slow down and/or data-path speed up over time has resulted in the 0-to-1 transition occurring farther down the delay line than originally designed.

Initially, a logic value 1 is clocked into flip-flops 332 and 342 on the first rising edge of clock CL, as shown at time $t_1$ on the timing diagram in FIG. 6. Accordingly, the Q outputs of flip-flops 332 and 342 transition from a logic value 0 to a logic value 1. Just before the second rising edge of clock CL at time $t_2$, the 0-to-1 transition is observed across the entire gross-delay element 344 and the outputs of the first seven DLEs $406_0$-$406_6$ of the delay line in fine-delay detector circuit 346. At time $t_2$ in FIG. 6, at the second rising edge of clock CL, a logic value 1 will be observed at the outputs of the first seven DLEs nearest input $TR_{IN}$ (i.e., DLEs $406_0$-$406_6$). The output of remaining DLEs $406_7$ and $406_8$ will show logic value 0. The second rising edge of clock CL will also register logic value 1 into flip-flops 334 and 348 in FIG. 3, and timing failure indicator 380 will eventually register a logic value 0, indicating that timing constraints were met.

The second rising edge of clock CL will also register a logic value 1 into flip-flops $404_0$-$404_7$ and a logic value 0 into flip-flop $404_8$ in FIG. 4. Accordingly, the XOR output bit values B[0:7] will respectively have values {0000 0001}. Here, the eighth bit value $B_7$ of logic value 1 indicates that the 0-to-1 transition occurs within the eighth DLE $406_7$ at the time of the second rising edge of clock CL (time $t_2$). In other words, the input to DLE $406_7$ (and the output from DLE $406_6$) is a logic value 1, while the output from DLE $406_7$ has a logic value 0 at the time of the second rising edge of clock CL. These XOR output bit values show that the target timing margin was met with maximum detectable excess margin. In this case, the maximum detectable excess margin is approximately five DLE delays.

Case 3: Timing Not Met With Setup Violation

FIG. 7 illustrates Case 3, in which the target timing margin is not met, and a setup violation is detected. In Case 3, as in Cases 1 and 2, the initial value for the sum of the delays (i) from the clock CL to output Q of flip-flop 342, (ii) through gross-delay element 344, and (iii) through fine-delay detector 346 is selected to be equal to about one clock period (i.e., the target timing margin is assumed to be minimal, such that little or no slack exists). In Case 3, however, a combination of clock-distribution speed-up and/or data-path slow-down over time has resulted in the 0-to-1 transition occurring so far up the delay line that the target timing margin is exceeded, and a setup violation occurs.

In Case 3, at time $t_1$ in FIG. 7, a logic value 1 is clocked into flip-flops 332 and 342 on the first rising edge of clock CL. Accordingly, the Q outputs of flip-flops 332 and 342 transition from a logic value 0 to a logic value 1. Just before the second rising edge of the clock CL at time $t_2$, the 0-to-1 transition is observed across the entire gross-delay element 344 and at the output of the first DLE $406_0$ of the delay line. At time $t_2$, at the second rising edge of clock CL, a logic value 1 will be observed at the output of the first DLE nearest input $TR_{IN}$ (i.e., DLE $406_0$). The outputs of the eight remaining DLEs $406_1$-$406_8$ will all show logic 0. The second rising edge of clock CL will also register logic value 1 into flip-flop 334 in the undelayed shift register 330 in FIG. 3. However, the second rising edge of clock CL will register a logic value 0 into flip-flop 348 of the delayed shift register 340 in FIG. 3. As a result, timing failure indicator 380 will eventually register a logic value 1, indicating that a timing failure has occurred and that the target timing margin has not been satisfied.

The second rising edge of clock CL at time $t_2$ will also register a logic value 1 into flip-flops $404_0$-$404_1$ and a logic value 0 into flip-flops $404_2$-$404_8$ in FIG. 4. Accordingly, the XOR output bit values B[0:7] will respectively have values {0100 0000}. Here, output bit value $B_1$ of logic value 1 indicates that the 0-to-1 transition occurs within the second DLE $406_1$ at the time of the second rising edge of clock CL (time $t_2$). In other words, the input to DLE $406_1$ (and the output from DLE $406_0$) has a logic value 1 and the output from DLE $406_1$ has a logic value 0 at the time of the second rising edge of clock CL. These output bit values B[0:7] indicate that the target timing margin was not met, and that a setup violation of an approximately one-DLE delay magnitude has occurred.

The embodiment of FIGS. 3 and 4, like the embodiment of FIG. 2, has numerous advantages over the prior art. As an initial matter, the embodiment of FIGS. 3 and 4 shares all of the advantages of FIG. 2 described above. In addition, the embodiment of FIGS. 3 and 4 provides not only a yes/no timing failure indicator but also a numeric measure (both positive and negative) of the actual timing margin. Further, the range of timing margin measurement may be adjusted by adjusting the gross delay 344 and/or the number of delay line elements and their corresponding flip-flops and XOR logic gates. Moreover, a range of clock frequencies may be accommodated by making the gross path delay element 344 adjustable during the operation of timing monitor circuit 310. Finally, the relative range of the positive-to-negative timing-margin measurement capability can be managed by varying the position of output $TR_{OUT}$ with respect to the DLEs in fine-delay detector circuit 346.

Although the present invention has been described in the context of circuits having XOR logic gates 260, 360, the present invention can also be implemented using other types of logic gates, such as not-XOR (NXOR) gates.

In addition, although the fine-delay detector circuit 346 shown in FIG. 4 includes nine DLEs $406_0$-$406_8$, nine flip-flops $404_0$-$404_8$, and eight XOR logic gates $402_0$-$402_7$, in practice the quantities of DLE's, flip-flops, and XOR logic gates may be made larger or smaller than those shown in FIG. 4, according to the amount of fine-delay resolution that is desired for a particular application.

Further, although data signals 224, 324 are generated by pulse generators 220, 320 in the embodiments depicted in FIGS. 2 and 3 above, it should be recognized that the use of pulse generator 220 is optional. Thus, in one embodiment of the present invention, the data signal traversing critical data path 202 (e.g., the output signal from circuit element 204) may be split and used as data signal 224, which is input to flip-flops 232, 242 and/or 332, 342.

The present invention may be implemented as digital (or a hybrid of both analog and digital) circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, micro-controller, or general-purpose computer.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Signals and corresponding nodes or ports may be referred to by the same name and are interchangeable for purposes here.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention. Rather, the scope of the invention is expressed in the following claims.

The present invention has been described in the context of shifter register 240 of FIG. 2 having delay element 244 and shift register 340 of FIG. 3 having delay elements 344 and 346. In general, shift registers of the present invention can be implemented with any suitable circuitry that adds an appropriate amount of delay to the signals propagating through the shift register.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

We claim:

1. An integrated circuit having a monitor circuit for monitoring timing in a critical path in the integrated circuit, the critical path having a target timing margin, the monitor circuit comprising:

a first shift register having an input and an output, the first shift register including a delay circuit that applies a delay value to a received signal;

a second shift register having an input and an output, wherein the inputs of the first and second shift registers are connected together to form a signal input node capable of receiving an input signal; and a logic circuit having an output and at least two inputs, each input connected to a corresponding one of the outputs of the first and second shift registers, wherein the output of the logic circuit indicates whether the target timing margin is satisfied or not satisfied, wherein:

the first shift register comprises:
   a first flip-flop having an input connected to the signal input node and an output;
   the delay circuit connected to the output of the first flip-flop, and
   a second flip-flop having an input connected to the delay circuit; and
the second shift register comprises:
   a third flip-flop having an input connected to the signal input node and an output; and
   a fourth flip-flop having an input connected to the output of the third flip-flop; and
the delay circuit comprises:
   a gross-delay element adapted to provide a gross delay value; and
   a fine-delay detector circuit adapted to generate, based on the gross delay value, an output signal indicating the extent to which the target timing margin is satisfied.

2. The integrated circuit of claim 1, wherein:
if the delay value is less than a predetermined period of time plus the target timing margin, then the logic circuit produces an output indicating that the target timing margin has been satisfied, and
if the delay value is greater than the predetermined period of time plus the target timing margin, then the logic circuit produces an output indicating that the target timing margin has not been satisfied.

3. The integrated circuit of claim 2, wherein, if an input pulse is inserted at the signal input node, then:
   (i) the first shift register produces a first pulse at its output;
   (ii) the second shift register produces a second pulse at its output; and
   (iii) the logic circuit produces an output indicating that the target timing margin has not been satisfied only if the first pulse is separated in time from the second pulse by an amount of time more than the predetermined period of time plus the target timing margin.

4. The integrated circuit of claim 1, wherein the logic circuit is one of an XOR logic gate and an NXOR logic gate.

5. The integrated circuit of claim 1, further comprising a pulse generator adapted to provide the input signal at an output connected to the signal input node.

6. The integrated circuit of claim 1, wherein the monitor circuit is (i) substantially independent of the critical path and (ii) located sufficiently near the critical path to be monitored in the integrated circuit such that an indication that the target timing margin has not been satisfied indicates that a timing problem exists in the critical path.

7. The integrated circuit of claim 1, wherein the fine-delay detector circuit comprises:
a delay line having an input and a plurality of delay-line elements connected in series, each delay-line element having an input and an output.

8. The integrated circuit of claim 7, wherein the fine-delay detector circuit further comprises:
a plurality of flip-flops, one or more flip-flops having an input and an output, the input of each being connected to the input of a corresponding delay-line element, wherein:
   the outputs of the plurality of flip-flops indicate the extent to which the target timing margin is satisfied.

9. The integrated circuit of claim 8, wherein the fine-delay detector circuit further comprises:
a plurality of logic gates, each logic gate having at least two inputs respectively connected to the outputs of a corresponding pair of adjacent flip-flops in the plurality of flip-flops in series along the delay line, wherein:
   the output of at least one logic gate indicates the extent to which the target timing margin is satisfied.

10. The integrated circuit of claim 1, wherein the first shift register comprises a first plurality of shift elements, and the second shift register comprises a second plurality of shift elements.

11. A method for monitoring timing in a critical path in an integrated circuit, the critical path having a target timing margin, the method comprising:
   (a) splitting an input signal into a first path including a first shift register and a second path including a second shift register;
   (b) delaying the input signal in the first path by a first delay;
   (c) comparing the input signal in the second path with the delayed input signal in the first path;
   (d) producing, based on the comparison, an output indicating whether the target timing margin is satisfied or not satisfied: and
   (e) detecting the extent to which the target timing margin is satisfied or not satisfied, wherein detecting the extent to which the target timing margin is satisfied or not satisfied comprises:
      after delaying the input signal in the first path by the first delay, consecutively delaying the input signal by a plurality of delay elements in a delay line; and
      for each delay element in the delay line, producing an output signal corresponding to the signal state at the input of the delay element.

12. The method of claim 11, wherein comparing the input signal in the second path with the delayed input signal in the first path comprises performing a logic operation on the outputs from the first path and the second path.

13. The method of claim 11, wherein:
if the input signal in the first path is delayed relative to the input signal in the second path by an amount of time less than a predetermined period of time plus the target timing margin, then the produced output indicates that the target timing margin has been satisfied, and
if the input signal in the first path is delayed relative to the input signal in the second path by an amount of time greater than the predetermined period of time plus the target timing margin, then the produced output indicates that the target timing margin has not been satisfied.

14. The method of claim 11, wherein detecting the extent to which the target timing margin is satisfied or not satisfied further comprises:
performing, for each consecutive pair of output signals corresponding to a consecutive pair of delay elements in the delay line, a logical operation to determine, based on the consecutive pair of output signals, whether the input signal has reached a corresponding delay element in the delay line at a time determined by a clock signal; and
outputting a result of the logical operation corresponding to at least one consecutive pair of output signals.

15. The method of claim 11, wherein the first shift register comprises a first plurality of shift elements, and the second shift register comprises a second plurality of shift elements.

16. An apparatus for monitoring timing in a critical path in an integrated circuit, the critical path having a target timing margin, the apparatus comprising:
   (a) means for splitting an input signal into a first path including a first shift register and a second path including a second shift register;
   (b) means for delaying the input signal in the first path by a first delay;

(c) means for comparing the input signal in the second path with the delayed input signal in the first path;

(d) means for producing, based on the comparison, an output indicating whether the target timing margin is satisfied or not satisfied; and (e) means for detecting the extent to which the target timing margin is satisfied or not satisfied, the means for detecting comprising:

means for consecutively delaying the input signal by a plurality of delay elements in a delay line, after delaying the input signal in the first path by the first delay; and means for producing, for each delay element in the delay line, an output signal corresponding to the signal state at the input of the delay element.

17. An integrated circuit having a monitor circuit for monitoring timing in a critical path in the integrated circuit, the critical path having a target timing margin, the monitor circuit comprising:

a first shift register having an input and an output, the first shift register including a delay circuit that applies a delay value to a received signal;

a second shift register having an input and an output, wherein the inputs of the first and second shift registers are connected together to form a signal input node capable of receiving an input signal; and a logic circuit having an output and at least two inputs, each input connected to a corresponding one of the outputs of the first and second shift registers, wherein the output of the logic circuit indicates whether the target timing margin is satisfied or not satisfied, wherein:

the delay circuit comprises:

a gross-delay element adapted to provide a gross delay value; and a fine-delay detector circuit adapted to generate, based on the gross delay value, an output signal indicating the extent to which the target timing margin is satisfied.

* * * * *